(12) United States Patent
Motohashi et al.

(10) Patent No.: US 8,790,134 B2
(45) Date of Patent: Jul. 29, 2014

(54) CONNECTOR, CABLE ASSEMBLY, AND SEMICONDUCTOR TESTING DEVICE

(75) Inventors: Nobumasa Motohashi, Yamato (JP); Akinori Mizumura, Yokohama (JP); Toshihiro Niitsu, Machida (JP); Teruhito Suzuki, Koza-gun (JP); Shin Sakiyama, Tokyo (JP)

(73) Assignees: Molex Japan Co., Ltd., Yamato (JP); Advantest Corporation, Tokyo (JP)

( * ) Notice: Subject to any disclaimer, the term of this patent is extended or adjusted under 35 U.S.C. 154(b) by 168 days.

(21) Appl. No.: 13/378,004

(22) PCT Filed: Jun. 30, 2010

(86) PCT No.: PCT/US2010/040519
§ 371 (c)(1),
(2), (4) Date: Dec. 13, 2011

(87) PCT Pub. No.: WO2011/002833
PCT Pub. Date: Jan. 6, 2011

(65) Prior Publication Data
US 2012/0094534 A1    Apr. 19, 2012

(30) Foreign Application Priority Data
Jun. 30, 2009    (JP) ................. 2009-156359

(51) Int. Cl.
*H01R 9/05*    (2006.01)

(52) U.S. Cl.
USPC ...................................... 439/585

(58) Field of Classification Search
USPC ............................ 439/585, 578; 174/74 R, 78
See application file for complete search history.

(56) References Cited

U.S. PATENT DOCUMENTS

| | | | |
|---|---|---|---|
| 7,114,989 B2 | 10/2006 | Yin | |
| 7,306,484 B1 | 12/2007 | Mahoney et al. | |
| 7,364,449 B2 | 4/2008 | Makino | |
| 7,597,563 B2 | 10/2009 | Shinkawa et al. | |
| 7,607,944 B2 | 10/2009 | Yoshioka et al. | |
| 7,909,646 B2 * | 3/2011 | Feldman et al. | 439/579 |
| 2003/0109180 A1 * | 6/2003 | Mueller | 439/680 |
| 2004/0206542 A1 | 10/2004 | Gladd et al. | |
| 2006/0110977 A1 * | 5/2006 | Matthews | 439/578 |

FOREIGN PATENT DOCUMENTS

JP    2005-301021    2/2006

OTHER PUBLICATIONS

International Search Report for PCT/US2010/040519.

* cited by examiner

*Primary Examiner* — Renee Luebke
*Assistant Examiner* — Larisa Tsukerman
(74) *Attorney, Agent, or Firm* — Timothy M. Morella

(57) ABSTRACT

The connector includes an enclosure including insertion holes formed therein, into which tip end portions of coaxial cables provided with signal terminals and with ground terminals arranged at parts of peripheries of the signal terminals are inserted, and auxiliary ground conductors, which are retained by the enclosure, are electrically connected to the ground terminals, and are arranged at other parts of the peripheries of the signal terminals.

14 Claims, 12 Drawing Sheets

CONNECTOR, CABLE ASSEMBLY, AND SEMICONDUCTOR TESTING DEVICE

FIELD OF THE INVENTION

The present invention relates to a connector, a cable assembly, and a semiconductor testing device. In particular, the present invention relates to technology for achieving enhancement of signal transmission characteristics.

BACKGROUND OF THE INVENTION

Conventionally, there has been known a connector which allows a coaxial cable to be inserted therein so as to electrically connect the coaxial cable and electrical equipment. In the above-mentioned coaxial cable, there is provided a ground conductor surrounding a signal line. The ground conductor shields electromagnetic waves from the exterior.

SUMMARY OF THE INVENTION

A tip end portion of the coaxial cable is provided with a signal terminal and a ground terminal. The signal terminal and the ground terminal are connected to the signal line and the ground conductor, and serve to contact with counterpart terminals, respectively. In the above-mentioned tip end portion, also, it is preferred to employ a coaxial structure in which the ground terminal surrounds the signal terminal, similarly to a coaxial cable. However, due to needs for reduction in space or the like, it may sometimes be difficult for the signal terminal and the ground terminal to have the coaxial structure. Therefore, there is a fear that signal transmission characteristics may be deteriorated.

Therefore, the present invention has been made in view of the above-mentioned circumstances, and it is a main object of the present invention to provide a cable assembly, a connector, and a semiconductor testing device, which allow enhancement of signal transmission characteristics even when it is difficult for a signal terminal and a ground terminal to have a coaxial structure.

In order to solve the above-mentioned problem, according to the present invention, there is provided a cable assembly including: a coaxial cable provided with a ground conductor surrounding a signal line; a signal terminal electrically connected to the signal line; a ground terminal electrically connected to the ground conductor and arranged at a part of a periphery of the signal terminal; an insulating support portion constituted by a dielectric body, which is attached to the signal terminal and the ground terminal; and an auxiliary ground conductor electrically connected to the ground terminal and arranged at another part of the periphery of the signal terminal so that the insulating support portion is positioned between the auxiliary ground conductor and the signal terminal.

Further, according to the present invention, there is provided a connector including: a signal terminal electrically connected to a signal line of a coaxial cable; a ground terminal electrically connected to a ground conductor of the coaxial cable and arranged at a part of a periphery of the signal terminal; an insulating support portion constituted by a dielectric body, which is attached to the signal terminal and the ground terminal; and an auxiliary ground conductor electrically connected to the ground terminal and arranged at another part of the periphery of the signal terminal so that the insulating support portion is positioned between the auxiliary ground conductor and the signal terminal.

According to the present invention, the ground terminal and an auxiliary ground terminal are arranged at the periphery of the signal terminal, and hence it is possible to enhance signal transmission characteristics in comparison with a case where only the ground terminal is used.

Further, according to an aspect of the present invention, the connector further includes an enclosure including an insertion hole formed therein, into which the signal terminal and the ground terminal are inserted, in which the auxiliary ground conductor is retained by the enclosure.

Further, according to an aspect of the present invention, the enclosure includes a contacting hole formed therein, into which at least a part of the auxiliary ground conductor is inserted, the contacting hole being continuous with the insertion hole. In this way, the auxiliary ground conductor is positioned in the contacting hole, and hence it becomes easy to keep the auxiliary ground conductor held in contact with the coaxial cable.

Further, according to an aspect of the present invention, mechanisms for fixing the auxiliary ground conductor in the contacting hole are provided to the contacting hole and the auxiliary ground conductor. In this way, the auxiliary ground conductor is fixed in the contacting hole, and hence it becomes easy to keep the auxiliary ground conductor held in contact with the coaxial cable.

Further, according to an aspect of the present invention, the auxiliary ground conductor includes an elastic arm elastically deformed due to contact with the coaxial cable and electrically connected to the ground terminal. As a result, it is possible to increase a contact pressure between the coaxial cable and the auxiliary ground conductor.

Further, according to an aspect of the present invention, the ground terminal includes a semi-tubular portion having a semi-tubular shape surrounding at least a half of a periphery of a base end portion of the signal terminal, and the auxiliary ground conductor is arranged on a side of an opening of the semi-tubular portion. In this manner, it is possible to surround the base end portion of the signal terminal with the ground terminal and the auxiliary ground conductor.

Further, according to an aspect of the present invention, the ground terminal includes a tip end portion arranged parallel to a tip end portion of the signal terminal, and the auxiliary ground conductor is arranged along the tip end portion of the signal terminal and the tip end portion of the ground terminal. As a result, it is possible to reduce the thickness of the tip end of the coaxial cable.

Further, according to an aspect of the present invention, the connector further includes a common conductor portion continuous with a plurality of auxiliary ground conductors. In this way, electric potentials of the ground conductors and the ground terminals of the coaxial cables become common.

Further, according to an aspect of the present invention, each of the plurality of auxiliary ground conductors includes a thinned portion crossing each of the plurality of auxiliary ground conductors in a width direction of each of the plurality of auxiliary ground conductors. As a result, it is possible to separate a desired auxiliary ground conductor, and hence it is possible to selectively set a coaxial cable in which the electrical potential of the ground conductor become common, and a coaxial cable in which the electrical potential of the ground conductor does not become common.

Further, according to an aspect of the present invention, the enclosure includes an extended portion, which extends in an insertion/pulling-out direction of the connector from a periphery of an opening-forming surface in which an opening of the insertion hole is formed, and which forms a recessed portion including the opening-forming surface as a bottom surface of the recessed portion. As a result, it becomes easy to insert and pull out the connector.

Further, according to an aspect of the present invention, a tip end portion of the extended portion is provided with a flange portion projecting in an outward direction of the opening-forming surface. As a result, it becomes even easier to insert and pull out the connector.

Further, according to an aspect of the present invention, when the connector serving as a male connector fits into a female connector serving as a counterpart for the male connector, the extended portion is positioned outside the female connector. In this way, it becomes still easier to insert and pull out the connector. Further, according to the present invention, there is provided a semiconductor testing device including the above-mentioned cable assembly according to the present invention.

DESCRIPTION OF THE PREFERRED EMBODIMENTS

A connector, a cable assembly, and a semiconductor testing device according to an embodiment of the present invention are described with reference to the drawings.

Figure 1:
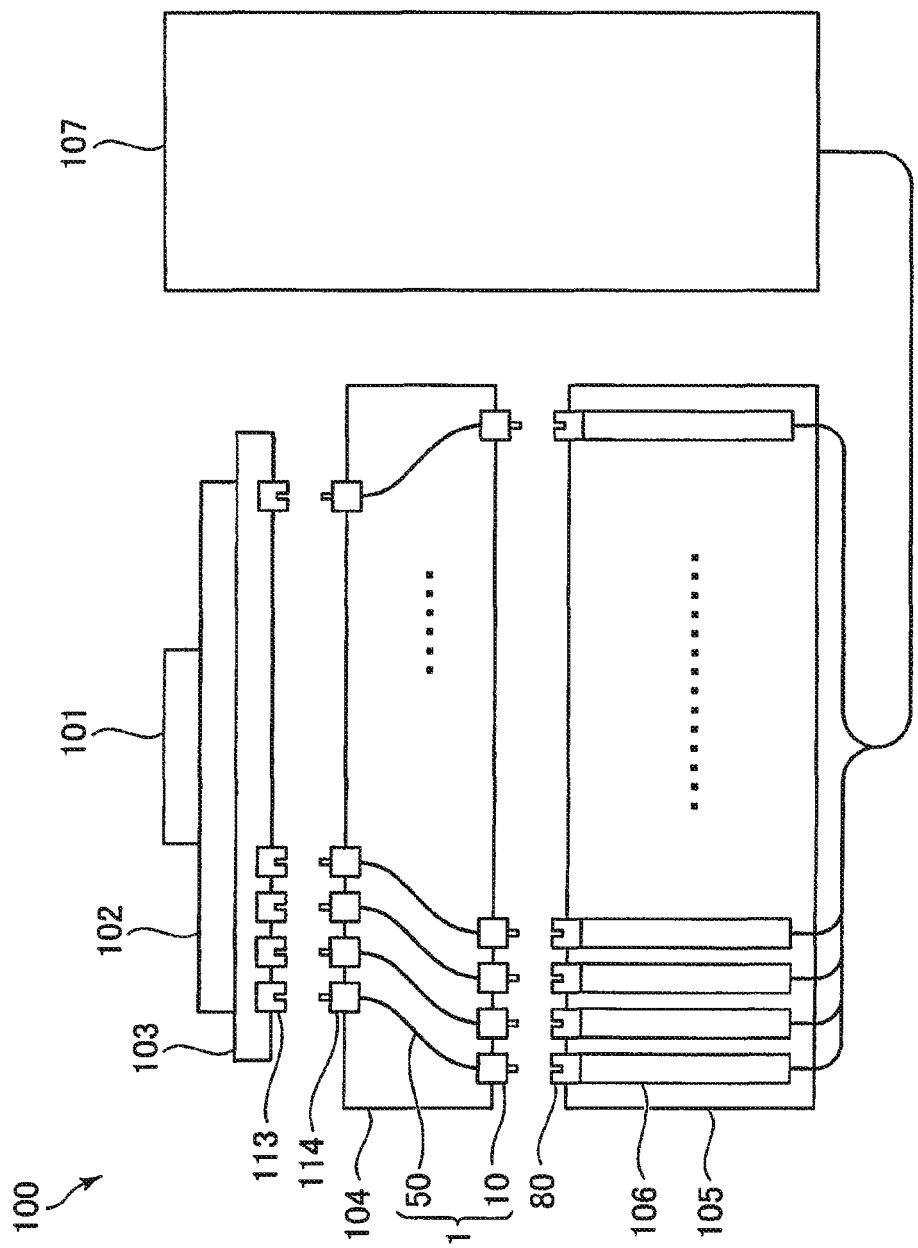
FIG. 1 is a schematic view of a semiconductor testing device according to an embodiment of the present invention.

FIG. 1 is a schematic view of a semiconductor testing device 100 according to an embodiment of the present invention. The semiconductor testing device 100 includes: a test head 105; a mother board 104 to be arranged above the test head 105; a performance board 103 to be arranged above the mother board 104; and a device socket 102 to be arranged above the performance board 103.

A semiconductor 101 to be tested is mounted on the device socket 102. In a lower surface of the performance board 103, there are provided a plurality of connectors 113. Each of the connectors 113 is electrically connected to the semiconductor 101 through the performance board 103 and the device socket 102.

In an upper surface of the mother board 104, there are provided a plurality of connectors 114. Into each of the connectors 114, an upper end of each of coaxial cables 50 housed in the mother board 104 is inserted. In a lower surface of the mother board 104, there are provided a plurality of connectors 10 according to the embodiment of the present invention. A lower end of each of the coaxial cables 50 housed in the mother board 104 is inserted into each of the connectors 10. Note that the connectors 10 and the coaxial cables 50 respectively constitute cable assemblies 1 according to the embodiment of the present invention.

On an upper surface of the test head 105, there are provided a plurality of counterpart connectors 80 to fit to the connectors 10. Each of the counterpart connectors 80 is attached on an end portion of a circuit board of the test head 105 and is connected to each of testing modules 106. Each of the testing modules 106 generates a testing signal corresponding to instructions from a testing-device main-body 107, and outputs the testing signal to the semiconductor 101.

Figure 2A:
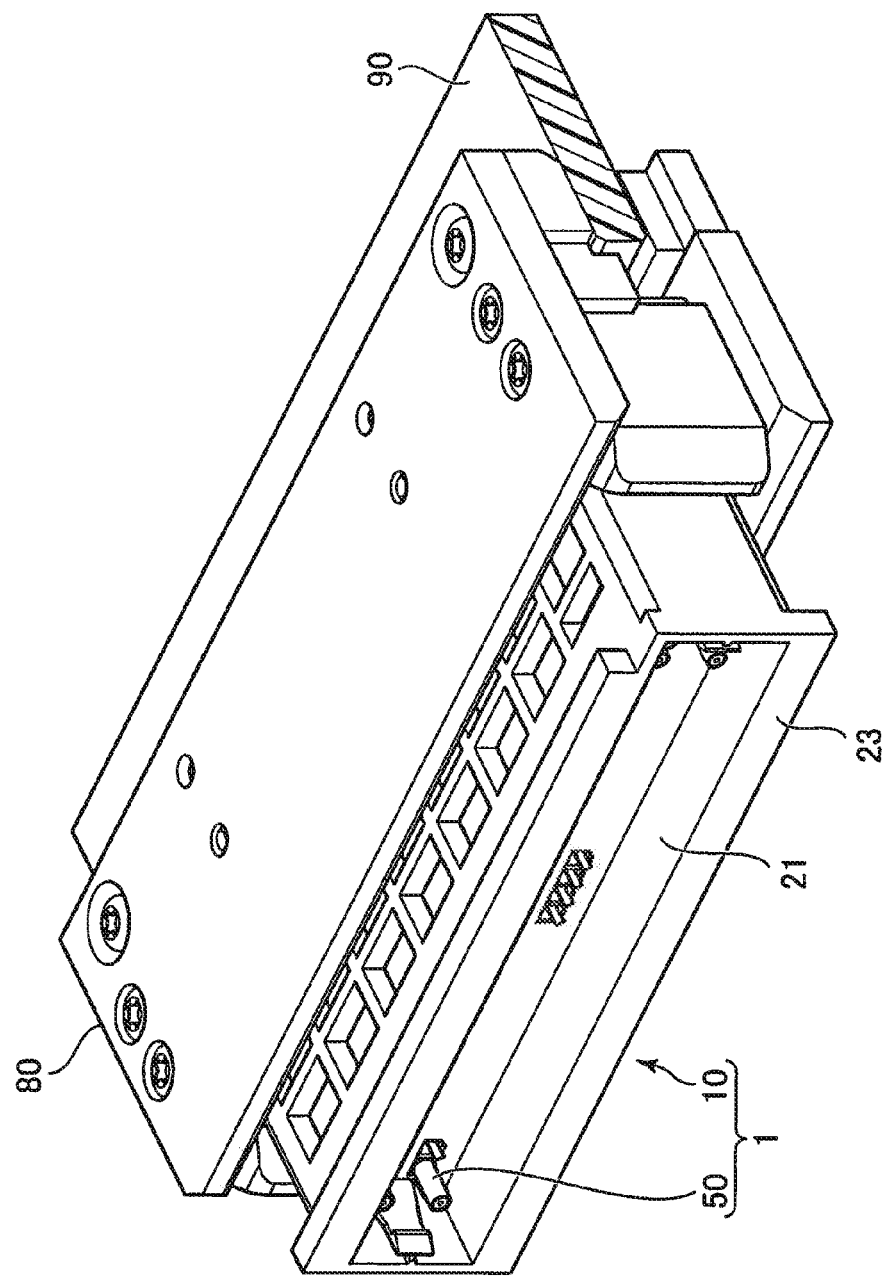
FIG. 2A is a perspective view illustrating a fitting state of a connector according to the embodiment of the present invention.
Figure 2B:
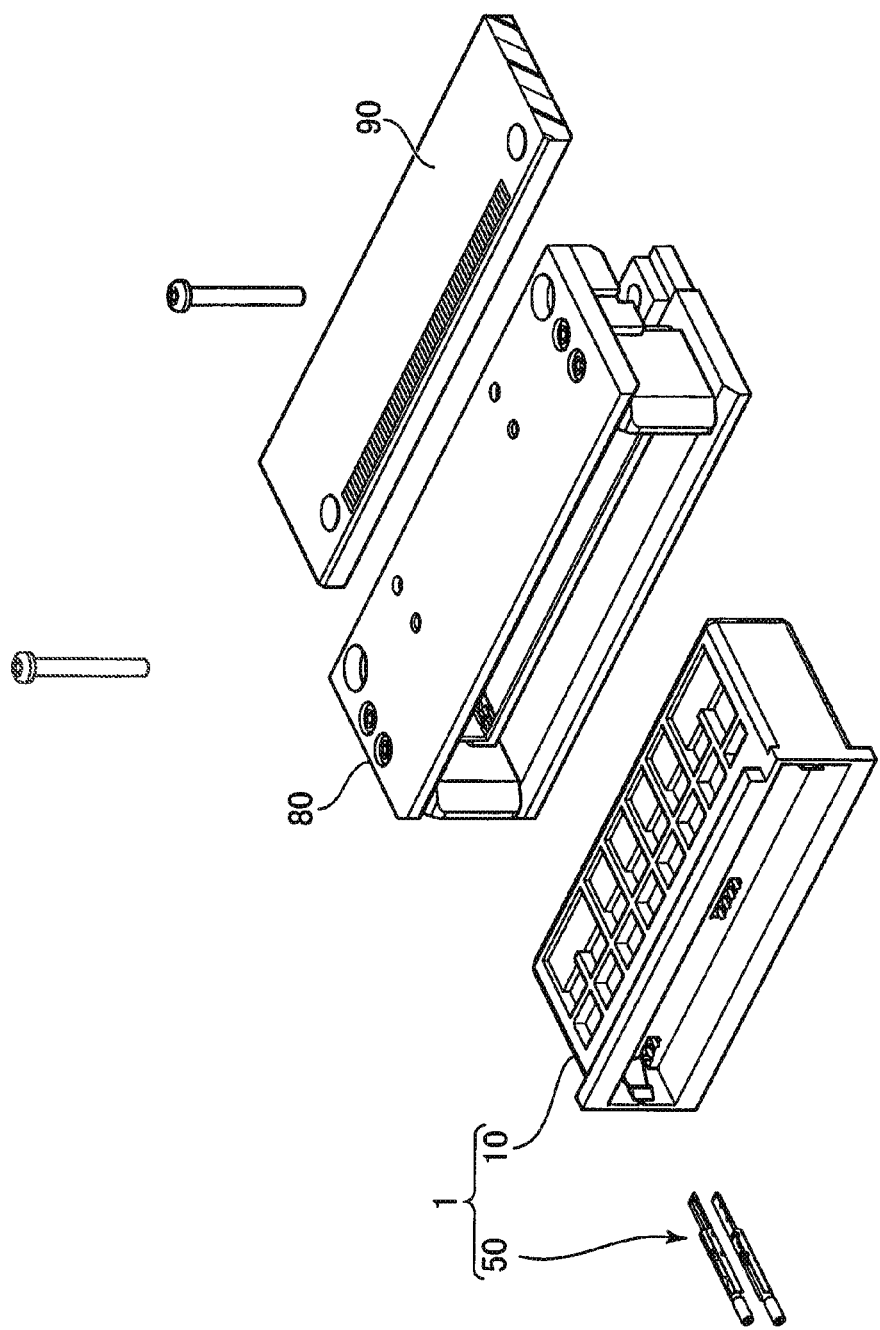
FIG. 2B is an exploded perspective view illustrating the fitting state of the connector according to the embodiment of the present invention.

FIG. 2A and FIG. 2B are a perspective view and an exploded perspective view, respectively, illustrating a fitting state of the connector 10. As illustrated in FIG. 2A and FIG. 2B, the connector 10 is structured as a male connector having a substantially rectangular box shape. One larger side of the connector 10 is inserted into the counterpart connector 80 serving as a female connector. The coaxial cable 50 is attached to the other larger side of the connector 10. The counterpart connector 80 is fixed to the end portion of a circuit board 90.

Figure 3:
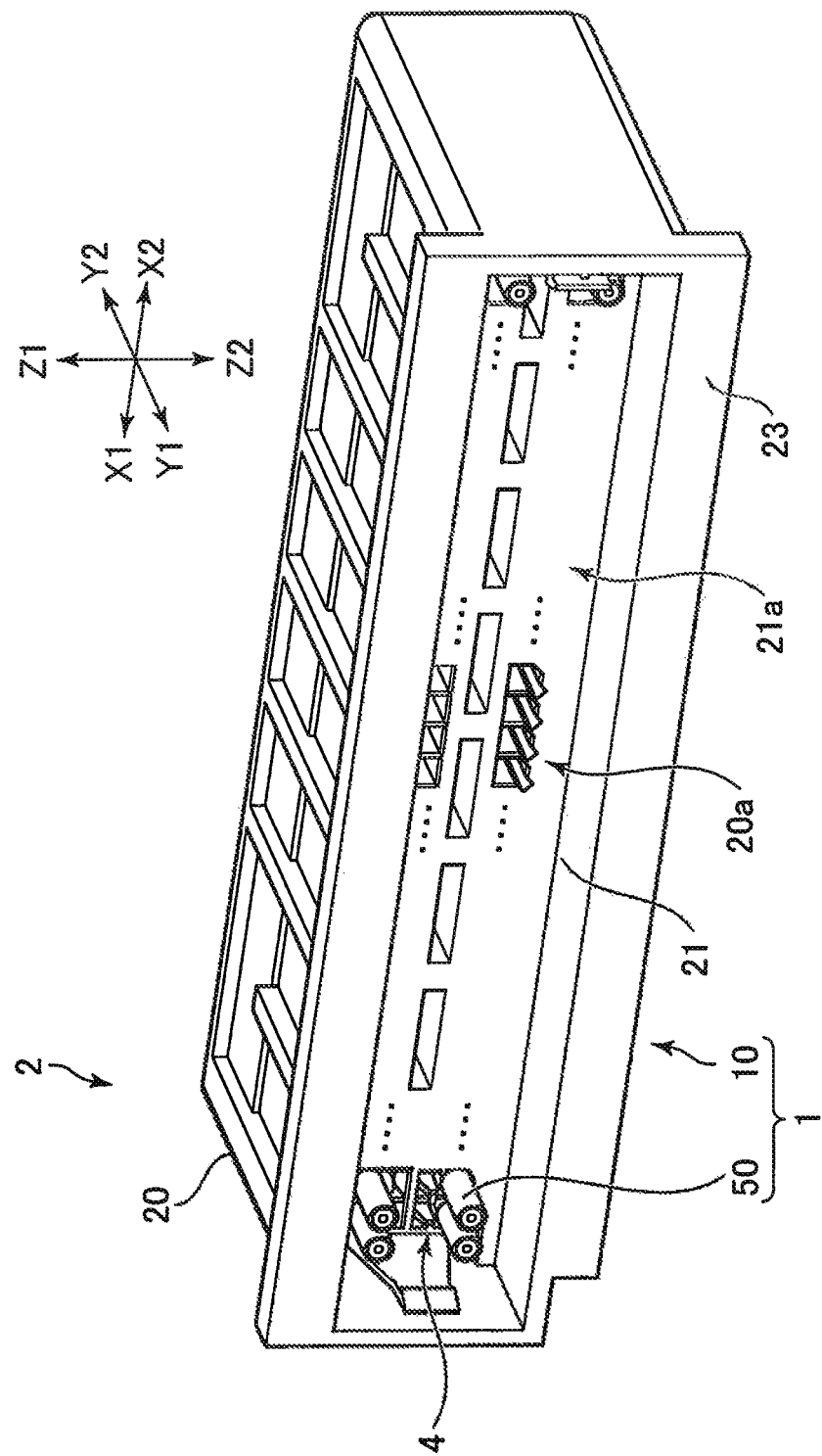
FIG. 3 is a perspective view of the connector according to the embodiment of the present invention.
Figure 4A:
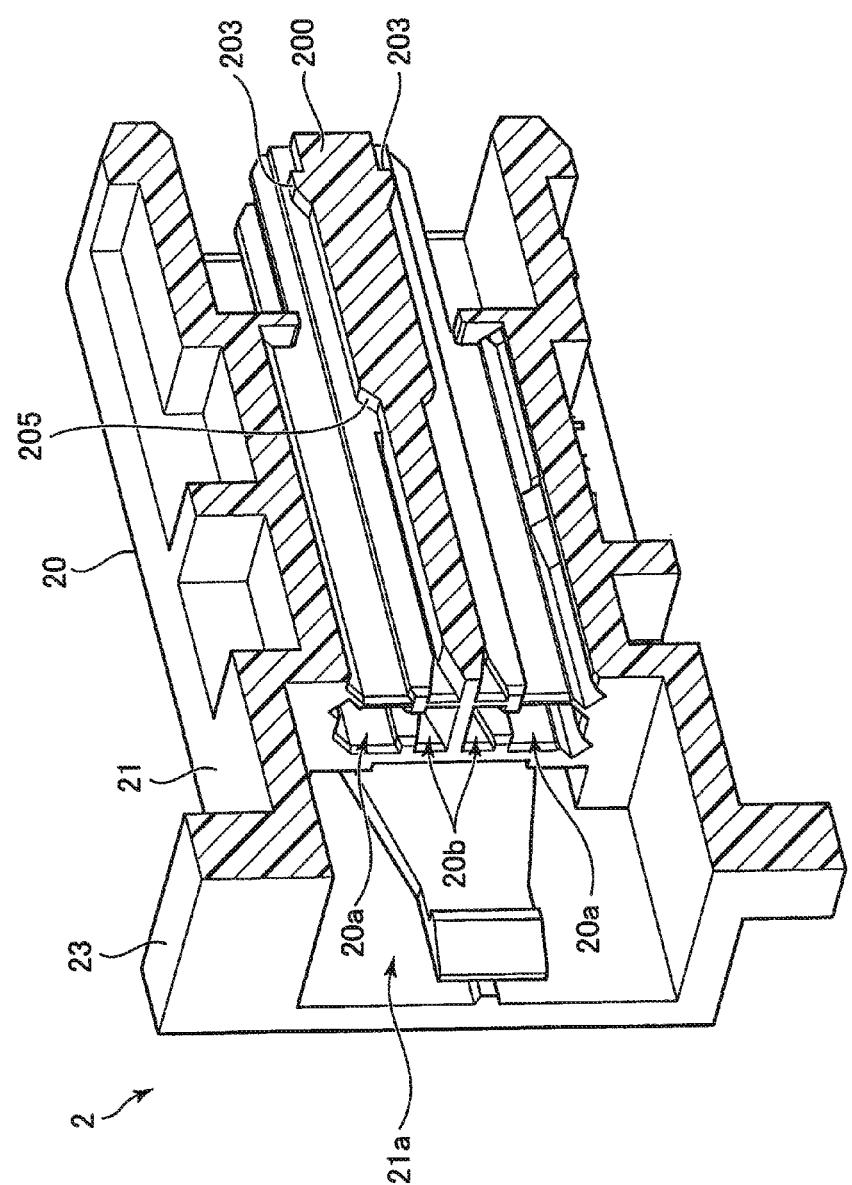
FIG. 4A is a sectional view illustrating assembling of the connector according to the embodiment of the present invention.
Figure 4B:
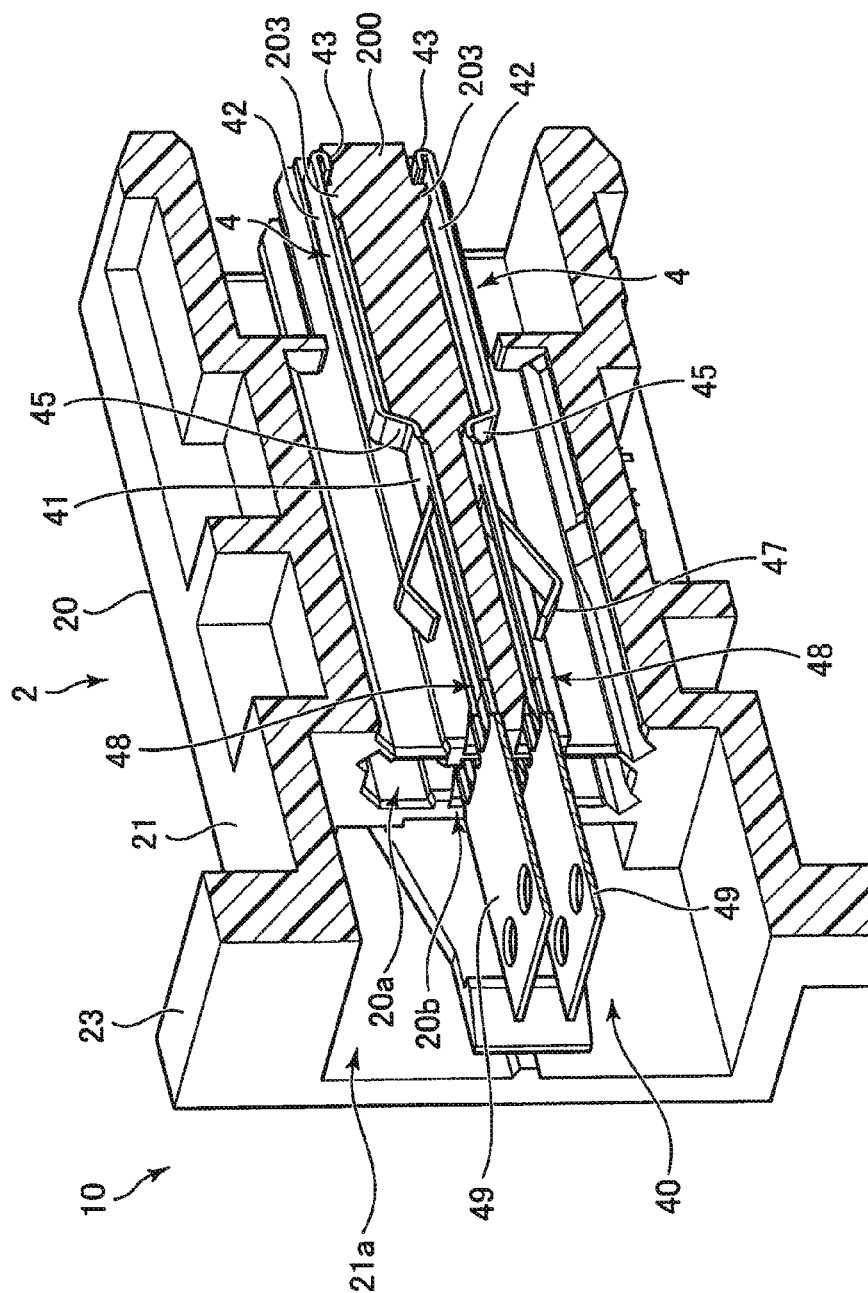
FIG. 4B is a sectional view illustrating assembling of the connector according to the embodiment of the present invention.
Figure 4C:
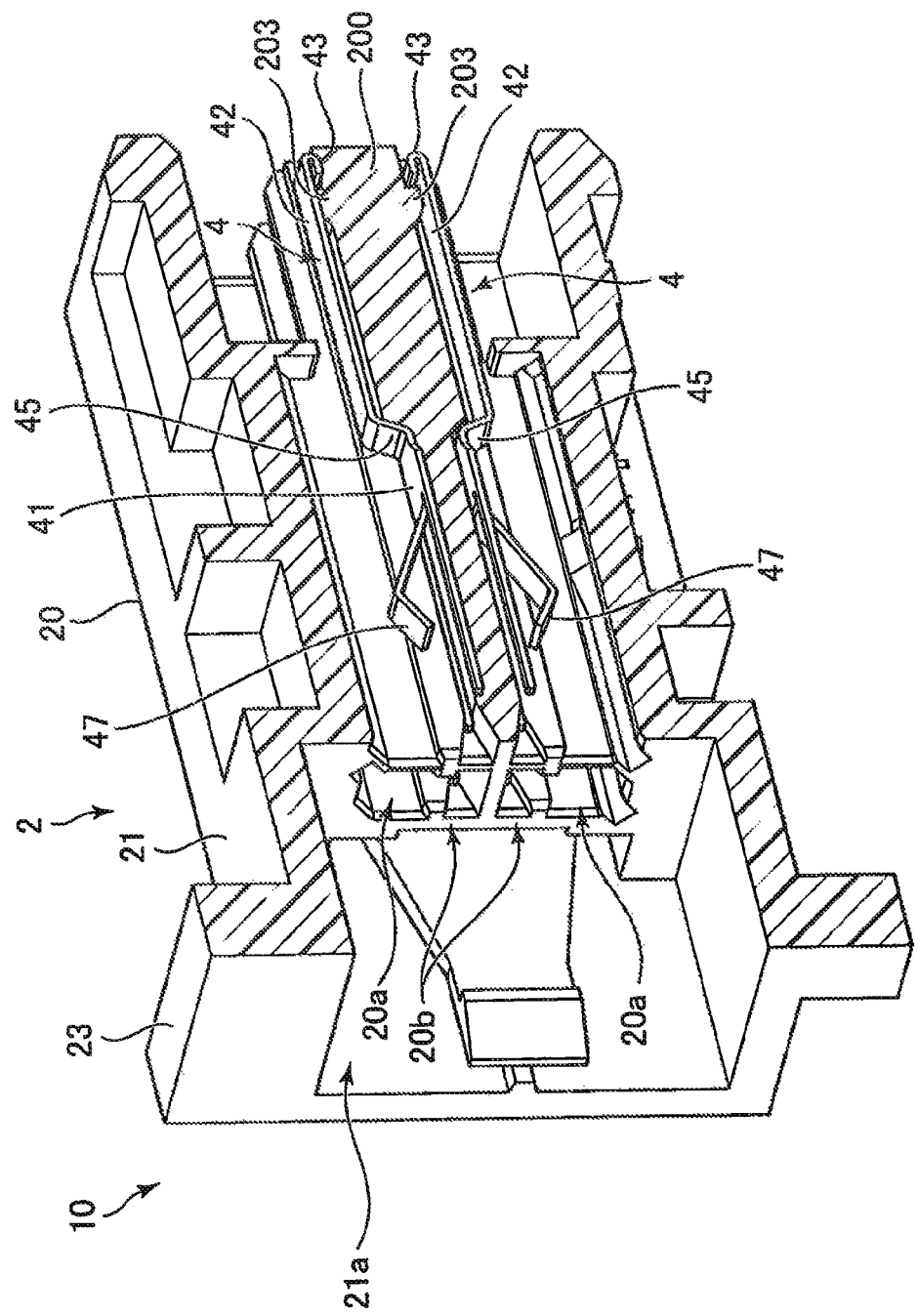
FIG. 4C is a sectional view illustrating assembling of the connector according to the embodiment of the present invention.
Figure 5A:
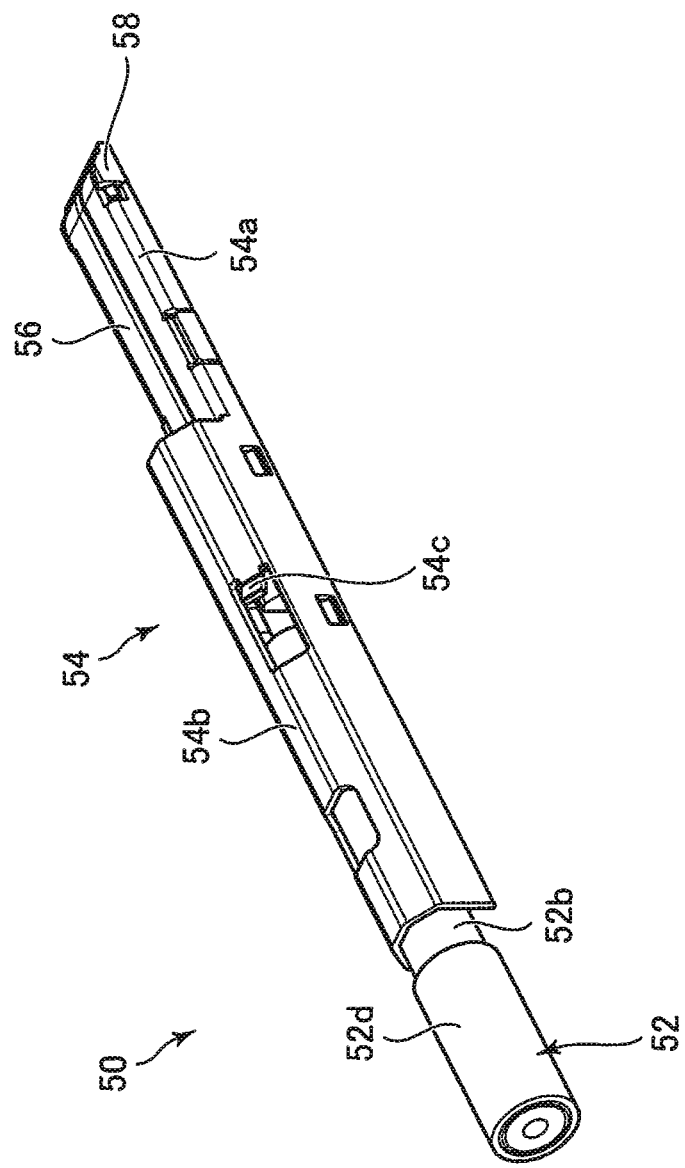
FIG. 5A is a perspective view of a tip end portion of a coaxial cable.
Figure 5B:
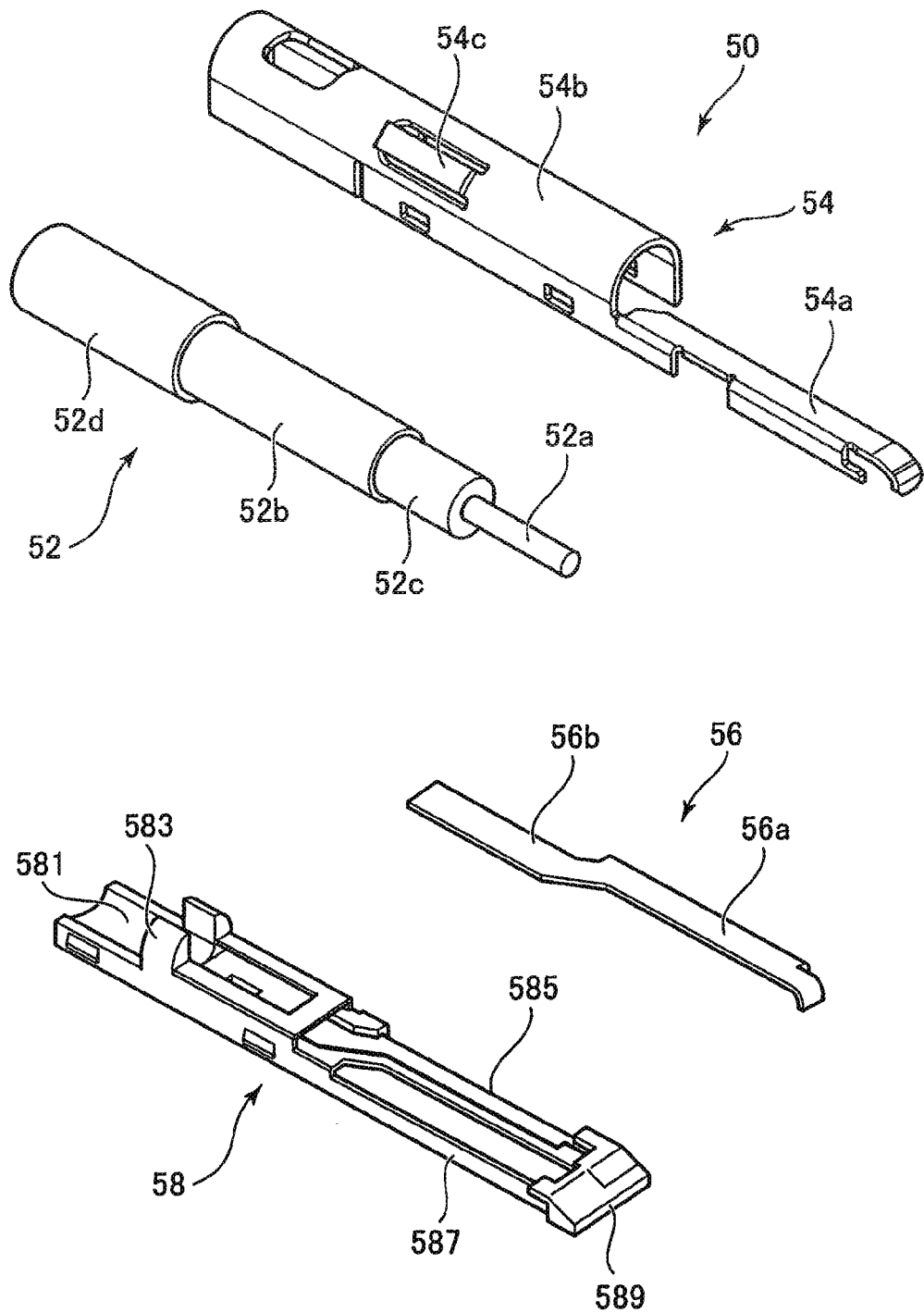
FIG. 5B is an exploded perspective view of the tip end portion of the coaxial cable.
Figure 6A:
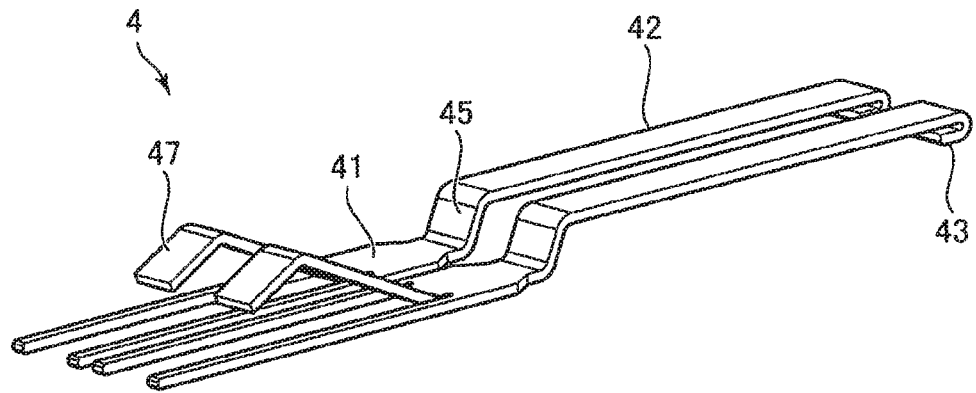
FIG. 6A is a perspective view of an auxiliary ground conductor.
Figure 6B:
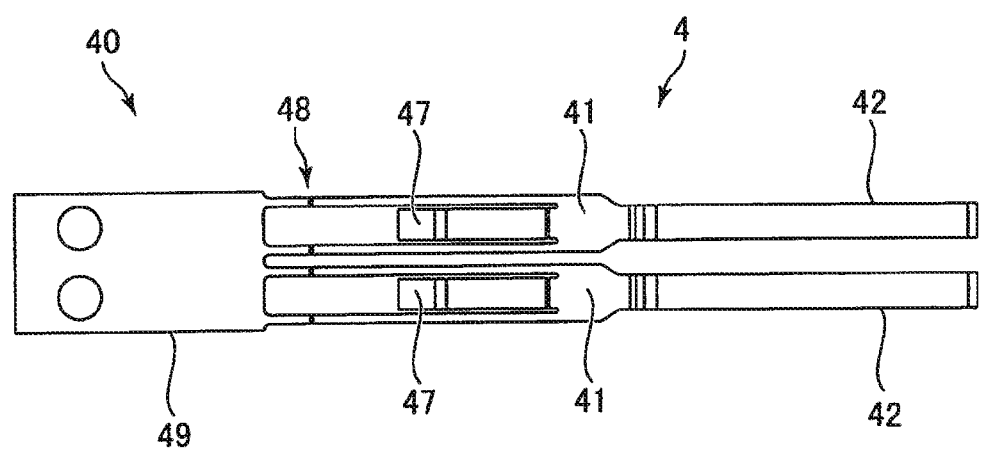
FIG. 6B is a plan view of the auxiliary ground conductor.
Figure 6C:
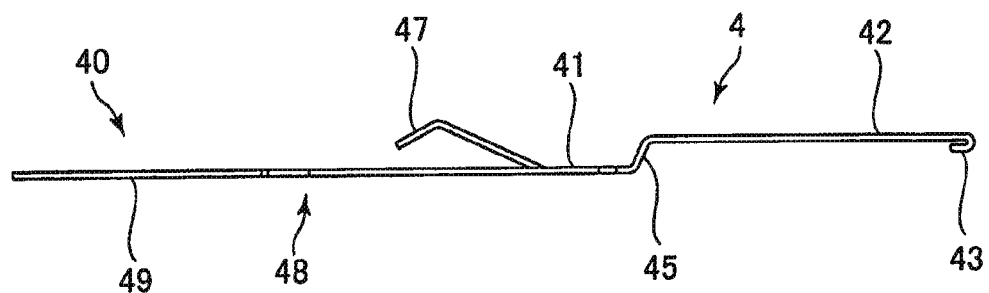
FIG. 6C is a side view of the auxiliary ground conductor.

FIG. 3 is a perspective view of the connector 10. In FIG. 3, some of the insertion holes 20a, contacting holes 20b, and the coaxial cables 50 are omitted from the drawing. FIG. 4A to FIG. 4D are sectional views illustrating assembling of the connector 10. FIG. 5A and FIG. 5B are a perspective view and an exploded perspective view, respectively, of a tip end portion of the coaxial cable 50. FIG. 6A to FIG. 6C are a perspective view, a plan view, and a side view, respectively, of auxiliary ground conductors 4.

Figure 4D:
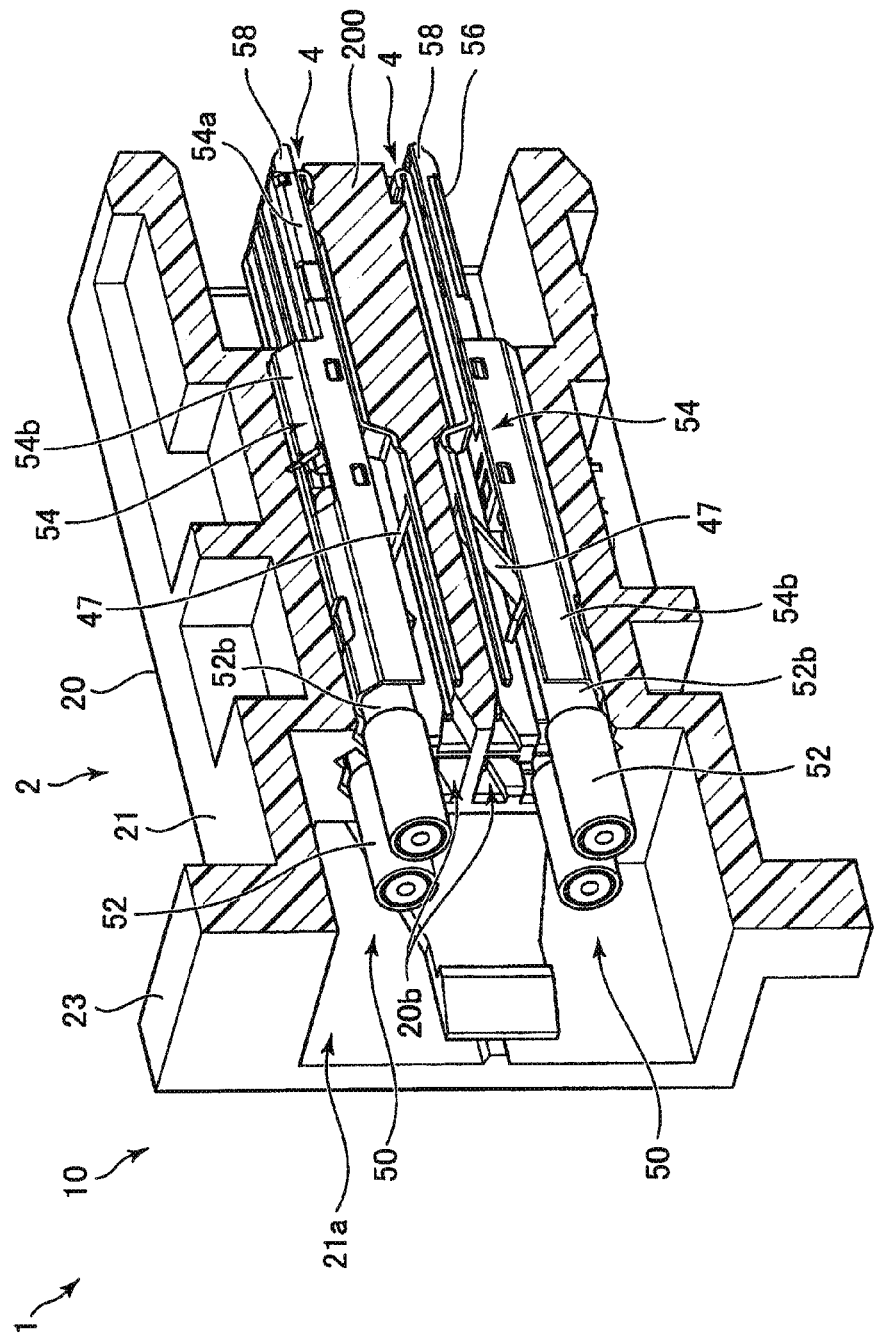
FIG. 4D is a sectional view illustrating assembling of the connector according to the embodiment of the present invention.

As illustrated in FIG. 3 to FIG. 4D, the connector 10 includes: an enclosure 2 having a substantially rectangular box shape; the auxiliary ground conductors 4 retained by the enclosure 2; and ground terminals 54, signal terminals 56, and insulating support portions 58 (to be described in detail later), which are provided at tip ends of the coaxial cables 50.

The enclosure 2 includes a main body portion 20 having a substantially rectangular box shape. The plurality of insertion holes 20a are formed in a surface on the Y1 direction side of the main body portion 20. The tip end portions of the coaxial cables 50 are inserted into the plurality of insertion holes 20a. The insertion holes 20a extend from the surface on the Y1 direction side of the main body portion 20 to the Y2 direction and are arranged in two rows in the Z1 and Z2 direction along the X1-X2 direction at predetermined intervals. The surface on the Y1 direction side of the main body portion 20 is an opening-forming surface in which openings of the insertion holes 20a are formed.

Further, the enclosure 2 includes an extended portion 21. The extended portion 21 has a rectangular frame shape extending from a periphery of the surface on the Y1 direction side of the main body portion 20 to the Y1 direction and surrounding the surface on the Y1 direction side. The extended portion 21 forms a recessed portion 21a including the surface on the Y1 direction side of the main body portion 20 as its bottom surface. Ends on the Y1 direction side of two larger side portions of the extended portion 21 are provided with a flange portion 23. The flange portion 23 projects in a outward direction of the surface on the Y1 direction side of the main body portion.

The extended portion 21 and the flange portion 23 are positioned outside the counterpart connector 80 when the connector 10 is inserted and fits into the counterpart connector 80 from the Y1 direction side (see FIG. 2A). The extended portion 21 and the flange portion 23 are grasped by a user when inserting or pulling out the connector 10.

Between the insertion holes 20a arranged in the two rows in the Z1 and Z2 direction in the surface on the Y1 direction side of the main body portion 20, the plurality of contacting holes 20b are formed in respective correspondence with the insertion holes 20a. The contacting holes 20b have substantially the same length as the insertion holes 20a, and are continuous with the insertion holes 20a. The auxiliary ground conductors 4 are inserted into the contacting holes 20b, the auxiliary ground conductors 4 coming into contact with the coaxial cables 50 inserted into the insertion holes 20a.

Inside the contacting holes 20b, a partition wall 200 located between the contacting holes 20b in the Z1 and Z2 direction is shaped to correspond to the auxiliary ground conductors 4 (see FIG. 4A). Specifically, the partition wall 200 has a two-step shape in which a half portion thereof on the Y2 direction side is larger in width than another half portion thereof on the Y1 direction side. Step portions 205 are provided between the half portions. Further, an end portion on the Y2 direction side of the partition wall 200 is provided with engaged portions 203 having convex shapes. The auxiliary ground conductors 4 are respectively engaged with the engaged portions 203.

As illustrated in FIG. 5A and FIG. 5B, the coaxial cable 50 includes the ground terminal 54 and the signal terminal 56 at the tip of a cable portion 52. The cable portion 52 includes: a signal line 52a; a ground conductor 52b having a tubular shape surrounding the signal line 52a; a dielectric body portion 52c interposed between the signal line 52a and the ground conductor 52b; and an outer skin portion 52d surrounding the ground conductor 52b. At the tip end portion of the cable portion 52, the ground conductor 52b, the dielectric body portion 52c, and the signal line 52a are exposed in the stated order to the tip end of the cable portion 52.

The dielectric body portion 52c of the cable portion 52 is provided with the insulating support portion 58 having a rectangular plate shape. The insulating support portion 58 is formed of an insulating resin material, and extends in the same direction as the cable portion 52. In a base end portion of the insulating support portion 58, there are provided a shallow valley portion 581 having a peripheral-surface shape and a sandwiching portion 583. The sandwiching portion 583 is provided on a tip end side with respect to the shallow valley portion 581, and protrudes in a plate-thickness direction while branching into two parts. The dielectric body portion 52c of the cable portion 52 is arranged on the valley portion 581. The sandwiching portion 583 sandwiches the signal line 52a of the cable portion 52.

The signal terminal 56 having a rectangular plate shape is fixed to the signal line 52a of the cable portion 52 by soldering. The signal terminal 56 is formed of a conductive thin metal plate, and extends in the same direction as the cable portion 52. The signal terminal 56 is attached between the sandwiching portion 583 and a tip end portion 589 of the insulating support portion 58. In the signal terminal 56, a base end portion 56b and a tip end portion 56a, which extend in the same direction as the cable portion 52, are shifted with respect to each other in the width direction thereof. As a result, the tip end portion 56a is shifted to one larger side portion 585 of the insulating support portion 58 while extending from a center portion to a tip end of the signal terminal 56.

The ground terminal 54 is fixed to the ground conductor 52b of the cable portion 52 by soldering. The ground terminal 54 is formed of a conductive thin metal plate. The ground terminal 54 includes a semi-tubular portion 54b and a tip end portion 54a. The semi-tubular portion 54b extends in the same direction as the cable portion 52. The tip end portion 54a extends from an end portion of the semi-tubular portion 54b in the same direction as the semi-tubular portion 54b, and has a substantially L-shaped cross-section. Further, the ground terminal 54 is provided with a cut-and-raised piece 54c for preventing detachment, the cut-and-raised piece 54c being cut and raised from the semi-tubular portion 54b. Note that FIG. 5A illustrates an example in which the semi-tubular portion 54b is structured to have a semi-octagonal tubular shape, and FIG. 5B illustrates an example in which the semi-tubular portion 54b is structured to have a semi-circular tubular shape.

The tip end portion of the cable portion 52 is inserted into the semi-tubular portion 54b of the ground terminal 54, and the semi-tubular portion 54b and the ground conductor 52b are fixed to each other by soldering. Further, the base end portion of the insulating support portion 58 is fixed onto the semi-tubular portion 54b so as to close a side of an opening of the semi-tubular portion 54b. The semi-tubular portion 54b covers more than half of a periphery of the signal line 52a exposed at the tip end of the cable portion 52 and more than half of a periphery of the base end portion 56b of the signal terminal 56.

The tip end portion 54a of the ground terminal 54 is fixed onto a larger side portion 587 of the insulating support portion 58, which is located on a side opposite to the larger side portion 585 on which the tip end portion 56a of the signal terminal 56 is positioned. In this manner, the tip end portion 56a of the signal terminal 56 and the tip end portion 54a of the ground terminal 54 are arranged in parallel in the width direction. The tip end portion 56a of the signal terminal 56 and the tip end portion 54a of the ground terminal 54 come into contact with terminals retained by the counterpart connector 80 when the connector 10 fits into the counterpart connector 80.

The tip end portion of the above-mentioned coaxial cable 50 is, as illustrated in FIG. 4D, inserted into the insertion hole 20a of the enclosure 2 in such a manner that the side of the opening of the semi-tubular portion 54b of the ground terminal 54 and a back surface side of the insulating support portion 58 are oriented toward an inner side in the Z1-Z2 direction, that is, toward a side of the partition wall 200. Further, the contacting hole 20b of the enclosure 2 is positioned on the side of the opening of the semi-tubular portion 54b of the ground terminal 54.

As illustrated in FIG. 6A to FIG. 6C, each of the auxiliary ground conductors 4 is formed by bending a conductive thin metal plate, and has a shape extending in one direction to substantially the same length as that of the ground terminal 54 of the coaxial cable 50. Specifically, the auxiliary ground conductor 4 includes a base end portion 41, a tip end portion 42, an engaging claw portion 43, a step portion 45, and an elastic arm 47. The tip end portion 42 is shifted to a top surface side in the thickness direction with respect to the base end portion 41. The engaging claw portion 43 is folded back to a back surface side at the tip end of the tip end portion 42. The step portion 45 links the base end portion 41 with the tip end portion 42. The elastic arm 47 is raised and bent to the top surface side from the base end portion 41. Further, the elastic arm 47 is capable of being elastically deformed to the back surface side.

The above-mentioned auxiliary ground conductor 4 is, as illustrated in FIG. 4C, inserted into the contacting hole 20b of the enclosure 2 in such a manner that the back surface side thereof is oriented to the inner side in the Z1-Z2 direction, that is, to the side of the partition wall 200. Specifically, when the auxiliary ground conductor 4 is inserted into the contacting hole 20b, the step portion 45 abuts against the step portion 205 of the partition wall 200. At the same time, the engaging claw portion 43 passes over the engaged portion 203 of the partition wall 200 and is engaged with the engaged portion 203 of the partition wall 200. Further, a part of the elastic arm 47 enters the insertion hole 20a.

Further, as illustrated in FIG. 4D, when the tip end portion of the coaxial cable 50 is inserted into the insertion hole 20a of the enclosure 2, the elastic arm 47 of the auxiliary ground conductor 4 is forced down to the base end portion 41 side by the tip end portion of the coaxial cable 50. As a result, contact pressure is generated. Specifically, the elastic arm 47 of the auxiliary ground conductor 4 is held in contact with the ground conductor 52b of the cable portion 52, which is retained in the semi-tubular portion 54b of the ground terminal 54. As a result, the ground conductor 52b, the ground terminal 54, and the auxiliary ground conductor 4 are electrically connected to each other, and hence have the same electric potential.

Here, the auxiliary ground conductor 4 is arranged so as to be opposed to the insulating support portion 58 provided at the tip end portion of the coaxial cable 50. Specifically, the tip end portion 42 of the auxiliary ground conductor 4 is arranged so as to close the tip end portion of the semi-tubular portion 54b of the ground terminal 54, that is, a side of an opening of a portion of the semi-tubular portion 54b, in which the signal line 52a of the cable portion 52 and the base end portion 56b of the signal terminal 56 are arranged. In addition, the tip end portion 42 of the auxiliary ground conductor 4 is opposed to the tip end portion 54a of the ground terminal 54 and the tip end portion 56a of the signal terminal 56 arranged parallel to each other, through the insulating support portion 58.

The auxiliary ground conductor 4 is arranged as described above, and hence the number of the ground conductors (in this embodiment, the ground terminal 54 and the auxiliary ground conductor 4) arranged around the signal line 52a exposed to the tip end of the cable portion 52 and around the signal terminal 56 is increased in comparison with a case where only the ground terminal 54 is used. Therefore, it is possible to enhance signal transmission characteristics of the coaxial cable 50.

Note that the base end portion 41 of the auxiliary ground conductor 4 is separated further away from the coaxial cable 50 with respect to the tip end portion 42. Thus, a space is formed, and the space is used for the raised and bent elastic arms 47. Of the tip end portion of the coaxial cable 50, a portion opposed to the base end portion 41 is a portion in which the ground conductor 52b is positioned, and hence there is no particular problem in separating the coaxial cable 50 from the base end portion 41.

Assembling of the connector 10 will now be described. The connector 10 is assembled in the order of FIG. 4A to FIG. 4D. Specifically, in order to insert the auxiliary ground conductors 4 into the contacting holes 20b of the enclosure 2, as illustrated in FIG. 4B, a common conductor 40 is used. In the common conductor 40, the plurality of auxiliary ground conductors 4 are coupled to each of common conductor portions 49. The auxiliary ground conductors 4 are inserted into the contacting holes 20b of the enclosure 2 at one time before the auxiliary ground conductors 4 are separated from the common conductor portions 49 at thinned portions 48 (see FIG. 6B and FIG. 6C), which are formed so as to cross the common conductor 40 in the width direction thereof. Thus, the auxiliary ground conductors 4 exist separately in the respective contacting holes 20b as illustrated in FIG. 4C. After that, as illustrated in FIG. 4D, the tip end portions of the coaxial cables 50 are inserted into the insertion holes 20a of the enclosure 2.

Figure 7:
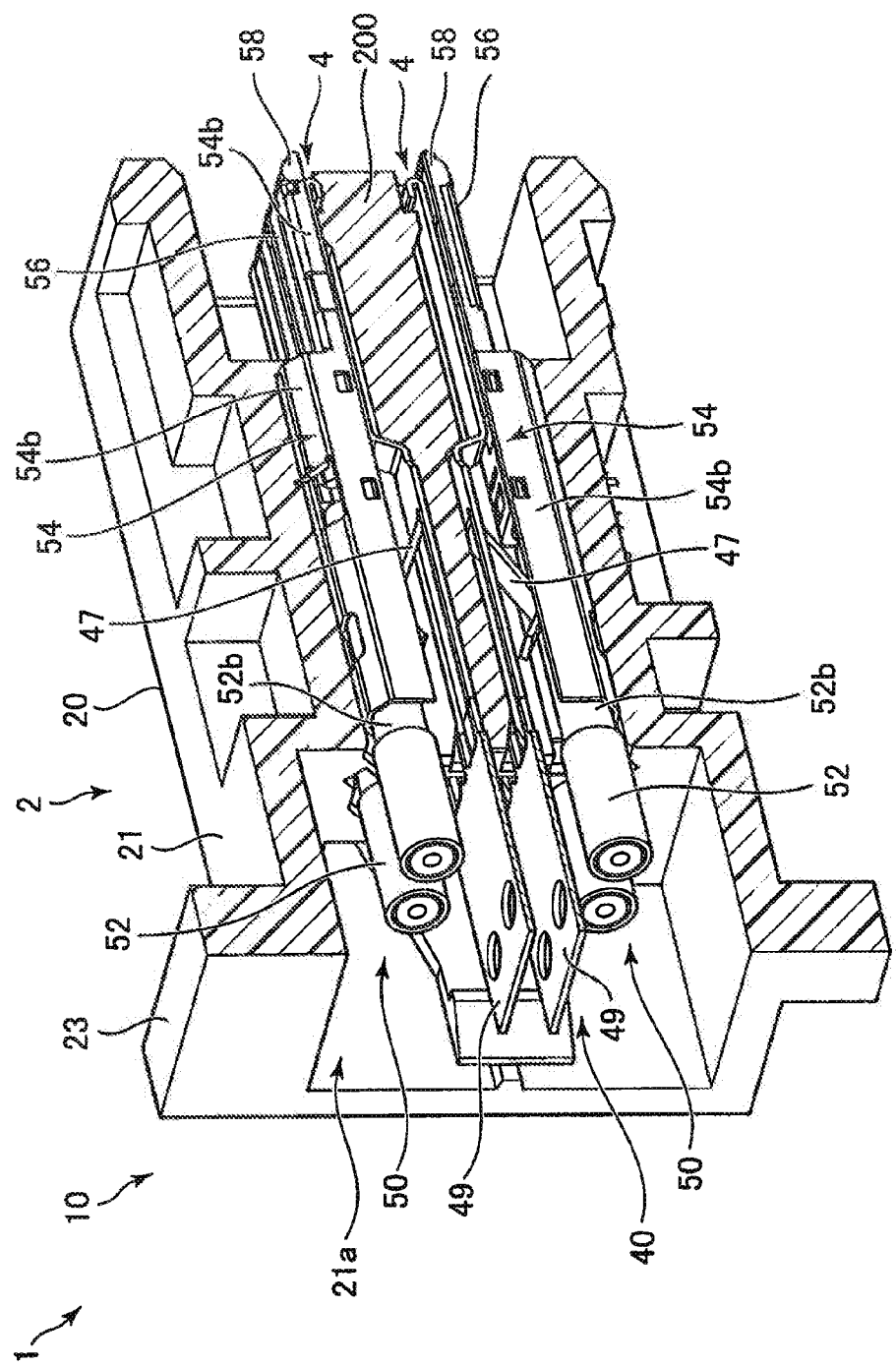
FIG. 7 is a sectional view of a connector according to a variant of the present invention.

Note that the present invention is not limited to the above-mentioned embodiment. It is possible that, as illustrated in FIG. 7, in a state in which each of the common conductor portions 49 is not separated from the plurality of auxiliary ground conductors 4, the tip end portions of the coaxial cables 50 are inserted into the insertion holes 20a of the enclosure 2. As a result, the electric potentials of the ground conductor 52b and the ground terminal 54, which are provided on each of the coaxial cables 50, and a potential of the auxiliary ground conductor 4 become common by each of the common conductor portions 49.

Further, for example, in a case where some of the coaxial cables 50 are used for electrical power supply, the auxiliary ground conductors 4 corresponding to the coaxial cables 50 for electrical power supply may be separated from the common conductor portions 49. As a result, it is possible to prevent power supply noise from affecting the coaxial cables 50 for signal transmission.

Though the embodiment of the present invention is described above, the present invention is not limited to the above-mentioned embodiment, and various modifications may be made by those skilled in the art. For example, the present invention is not limited to the above-mentioned embodiment in which the auxiliary ground conductors 4 are fixed to the enclosure 2, and metal plates corresponding to the tip end portions 42 of the auxiliary ground conductors 4 may be fixed to the tip end portions of the coaxial cables 50.

We claim:
1. A cable assembly, the cable assembly comprising:
a coaxial cable, the coaxial cable including a ground conductor surrounding a signal line;
a signal terminal electrically connected to the signal line;
a ground terminal electrically connected to the ground conductor, the ground terminal being arranged at a part of a periphery of the signal terminal, the ground terminal including a tip end portion arranged parallel to a tip end portion of the signal terminal;
an insulating support portion constituted by a dielectric body, the insulating support portion being attached to the signal terminal and the ground terminal; and
an auxiliary ground conductor electrically connected to the ground terminal, the auxiliary ground conductor being arranged at another part of the periphery of the signal terminal so that the insulating support portion is positioned between the auxiliary ground conductor and the signal terminal, the auxiliary ground conductor being arranged along the tip end portion of the signal terminal and the tip end portion of the ground terminal, the auxiliary ground conductor including an engaging claw portion located on a tip end portion of the auxiliary ground conductor, the engaging claw portion opposing the tip end portion of the ground terminal and the tip end portion of the signal terminal.
2. A semiconductor testing device, comprising the cable assembly of claim 1.

3. A connector, comprising:
a signal terminal electrically connected to a signal line of a coaxial cable;
a ground terminal electrically connected to a ground conductor of the coaxial cable, the ground terminal being arranged at a part of a periphery of the signal terminal, the ground terminal including a tip end portion arranged parallel to a tip end portion of the signal terminal;
an insulating support portion constituted by a dielectric body, the insulating support portion being attached to the signal terminal and the ground terminal; and
an auxiliary ground conductor electrically connected to the ground terminal, the auxiliary ground conductor being arranged at another part of the periphery of the signal terminal so that the insulating support portion is positioned between the auxiliary ground conductor and the signal terminal, the auxiliary ground conductor being arranged along the tip end portion of the signal terminal and the tip end portion of the ground terminal, the auxiliary ground conductor including and engaging claw portion located on a tip end portion of the auxiliary ground conductor, the engaging claw portion opposing the tip end portion of the ground terminal and the tip end portion of the signal terminal.

4. The connector of claim 3, further comprising an enclosure, the enclosure including an insertion hole formed therein, into which the signal terminal and the ground terminal are inserted, the auxiliary ground conductor being retained by the enclosure.

5. The connector of claim 4, wherein the enclosure further includes a contacting hole formed therein, into which at least a part of the auxiliary ground conductor is inserted, the contacting hole being continuous with the insertion hole.

6. The connector of claim 5, wherein mechanisms for fixing the auxiliary ground conductor in the contacting hole are provided at the contacting hole and the auxiliary ground conductor.

7. The connector of claim 3, wherein the auxiliary ground conductor further includes an elastic arm elastically deformed due to contact with the coaxial cable and electrically connected to the ground terminal.

8. The connector of claim 3, wherein the ground terminal further includes a semi-tubular portion having a semi-tubular shape surrounding at least half of a periphery of a base end portion of the signal terminal.

9. The connector of claim 8, wherein the auxiliary ground conductor is arranged on a side of an opening of the semi-tubular portion.

10. The connector of claim 3, further comprising a common conductor portion continuous with a plurality of auxiliary ground conductors.

11. The connector of claim 10, wherein each auxiliary ground conductor includes a thinned portion crossing each auxiliary ground conductor in a width direction of each auxiliary ground conductor.

12. The connector of claim 3, wherein the enclosure further includes an extended portion, which extends in an insertion/pulling-out direction of the connector from a periphery of an opening-forming surface in which an opening of the insertion hole is formed, the extended portion forming a recessed portion, the recessed portion including the opening-forming surface as a bottom surface thereof.

13. The connector of claim 12, wherein a tip end portion of the extended portion includes a flange portion projecting in an outward direction of the opening-forming surface.

14. The connector of claim 12, wherein, when the connector serving as a male connector fits into a female connector serving as a counterpart for the male connector, the extended portion is positioned outside the female connector.

* * * * *